United States Patent [19]

Blanchard et al.

[11] Patent Number: 4,798,810

[45] Date of Patent: Jan. 17, 1989

[54] METHOD FOR MANUFACTURING A POWER MOS TRANSISTOR

[75] Inventors: Richard A. Blanchard, Los Altos; Adrian Cogan, San Jose, both of Calif.

[73] Assignee: Siliconix Incorporated, Santa Clara, Calif.

[21] Appl. No.: 838,217

[22] Filed: Mar. 10, 1986

[51] Int. Cl.[4] .................. H01L 21/265; H01L 21/22
[52] U.S. Cl. ..................... 437/29; 437/148; 437/150; 437/154; 437/41; 437/913; 357/23.4
[58] Field of Search .......... 357/23.4, 53, 55; 29/571, 578, 580; 437/148, 149, 150, 151, 152, 153, 154, 41, 27, 28, 29

[56] References Cited

U.S. PATENT DOCUMENTS

| | | | |
|---|---|---|---|
| 3,909,119 | 9/1975 | Wolley | 357/13 |
| 4,158,206 | 6/1979 | Neilson | 357/13 |
| 4,300,150 | 11/1980 | Colak | 357/23 |
| 4,345,265 | 8/1982 | Blanchard | 357/23 |
| 4,374,389 | 2/1983 | Temple | 357/13 |
| 4,414,560 | 11/1983 | Lidow | 357/39 |
| 4,443,931 | 4/1984 | Baliga et al. | 29/571 |
| 4,468,686 | 8/1984 | Rosenthal | 357/53 |
| 4,567,502 | 1/1986 | Nakagawa et al. | 357/53 |
| 4,609,929 | 9/1986 | Jayaraman et al. | 357/23.4 |
| 4,631,564 | 12/1986 | Neilson et al. | 357/23.4 |
| 4,646,117 | 2/1987 | Temple | 357/23.4 |

OTHER PUBLICATIONS

Conti et al, "Surface Breakdown in Silicon Planar Diodes Equipped With Field Plate", in *Solid State Electronics*, 1972, vol. 15, pp. 93–105.
Baliga et al., "The Insulated Gate Transistor: A New Three-Terminal MOS-Controlled Bipolar Device", IEEE Transactions on Electron Devices, vol. Ed-31, No. 6, Jun. 1984, pp. 821–828.

*Primary Examiner*—Brian E. Hearn
*Assistant Examiner*—T. N. Quach
*Attorney, Agent, or Firm*—Kenneth E. Leeds; Alan H. MacPherson; Paul J. Winters

[57] ABSTRACT

A process for manufacturing a DMOS transistor in accordance with the present invention includes the steps of forming a layer of gate insulation (12, 14) on an N type substrate (10). A layer of polycrystalline silicon (16) is formed on the gate insulation layer. A first mask (18) is used to define the polycrystalline silicon gate (16e, 16f). A layer of silicon dioxide (20) is then formed on the gate. A second mask (22) defines the gate contact region (window 22a)) as well as where a deep body region (24) is to be formed (window 14a)). Portions of the gate insulation layer not covered by the gate are subsequently removed. The P type body region (26) and N+ source region (28) are then formed having a lateral extent defined by the edge of the gate. A conductive layer 30 is patterned, thereby leaving a gate contact and a source and body contact. A passivation layer 34 is then patterned, thereby defining bonding pads. Of importance, the above-described process uses only 4 photolithographic masking steps. In one embodiment, the transistor is laterally surrounded by an equipotential ring (EQR) which includes a field limiting ring (16g), a p region (26a), and an N+ region (28a) (formed concurrently with gates (16e, 16f), body region (26), source region 28), respectively).

19 Claims, 3 Drawing Sheets

METHOD FOR MANUFACTURING A POWER MOS TRANSISTOR

BACKGROUND

This invention relates to MOS transistors and more specifically to methods for manufacturing MOS transistors with a minimum number of masking steps. The invention also relates to double diffused MOS ("DMOS") transistors.

A DMOS transistor is a MOS transistor having a channel length defined by the difference in diffusion of sequentially introduced impurities from a common edge or boundary. One example of a prior art process for manufacturing a DMOS transistor is discussed in U.S. Pat. No. 4,443,931, issued to Baliga, et al., incorporated herein by reference. It is known in the art that it is desirable to manufacture DMOS transistors while minimizing the number of masks used. One reason for this is that by minimizing the numbers of masks, the number of alignment steps is also minimized and therefore the need to accommodate alignment tolerances is minimized. As is known in the art, if the need to accommodate alignment tolerances is minimized, the size and cost of the resulting transistor is minimized.

Another reason for minimizing the number of masking steps it that the complexity of the manufacturing process is correspondingly reduced and thus the cost of producing the transistor is also reduced.

SUMMARY

A method for manufacturing a DMOS transistor in accordance with the present invention includes the step of providing a gate insulation layer on a semiconductor substrate. The semiconductor substrate is typically N type silicon and the gate insulation layer typically comprises a silicon nitride layer formed on a silicon dioxide layer. A gate is then formed on the gate insulation layer. In one embodiment of the invention, the gate is polycrystalline silicon and is formed by depositing a polycrystalline silicon layer on the gate insulation layer and using a first photolithographic mask to protect portions of the polycrystalline silicon layer while the exposed portions of the polycrystalline silicon layer are removed.

The resulting gate is covered with a second insulation layer which in one embodiment comprises silicon dioxide. A second photolithographic mask is formed on the wafer. In accordance with one novel feature of this invention, the second mask includes both a first window region defining the deep body region of the DMOS transistor and a second window region defining the gate contact. The portion of the second insulation layer within the second window region is removed. Of importance, the portion of the silicon nitride layer within the first window region is also removed and the underlying portion of the semiconductor substrate is thermally doped or implanted with P type dopant, thereby forming the deep body region.

A silicon dioxide layer is then formed within the second window region, typically by thermal oxidation. Of importance, the thickness of the silicon dioxide within the first region also increases during this process. The exposed portion of the silicon nitride layer and the underlying silicon dioxide layer are then removed using a blanket etching process which does not require additional masking. At the conclusion of the blanket etching process, however, the silicon dioxide formed on the gate and the silicon dioxide formed above the deep body region remain. The silicon dioxide above the deep body region serves as an oxide mask which defines part of subsequently formed body and source regions.

P type dopants are then implanted into the semiconductor substrate to form the body region of the DMOS transistor. Thereafter, N type dopants are implanted into the semiconductor substrate to form the source region. As mentioned above, the oxide mask grown over the deep body region prevents the underlying deep body region from being predepad or implanted with N type impurities. Of importance, the lateral extent of the source and the body regions is defined by the edge of the gate and the oxide mask. Therefore, it is not necessary to use an extra masking step to define the source and body regions of the DMOS transistor.

The oxide mask above the deep body region, the silicon dioxide within the second window, and any silicon dioxide formed above the source region during source and body drive-in are removed with a blanket etching process. A conductive layer (typically metal) is then formed on the surface of the wafer. A third photolithographic mask is applied to the wafer in order to pattern the conductive layer to form a gate lead and a source/body lead.

The wafer is then coated with a passivation layer of material such as silicon nitride or silicon dioxide at a low temperature (typically less than 450° C.). A fourth photolithographic mask is used to define regions where the passivation layer is to be removed, e.g. bonding pad regions. Of importance, the above described process requires only four photolithographic masks. Accordingly, the process is simpler than prior art DMOS manufacturing processes. Further, the need to increase the transistor size in order to allow for misalignment of the various photolithographic masks is reduced.

In one embodiment, the transistor is laterally surrounded by an equipotential ring (EQR). In accordance with one novel feature of the invention, the EQR includes a P region (formed concurrently with the body region) an N+ region within the P region (formed concurrently with the source region) and a conductive ring formed on the N+ region (formed concurrently with the gate lead and the source/body lead). The conductive ring is electrically coupled to the substrate, the P region, and the N+ region, and is biased at the same voltage as the transistor drain. As is explained in greater detail below, the EQR enhances the reliability of the DMOS transistor. Of importance, the EQR is formed without any extra masking steps.

DETAILED DESCRIPTION

Figure 1:
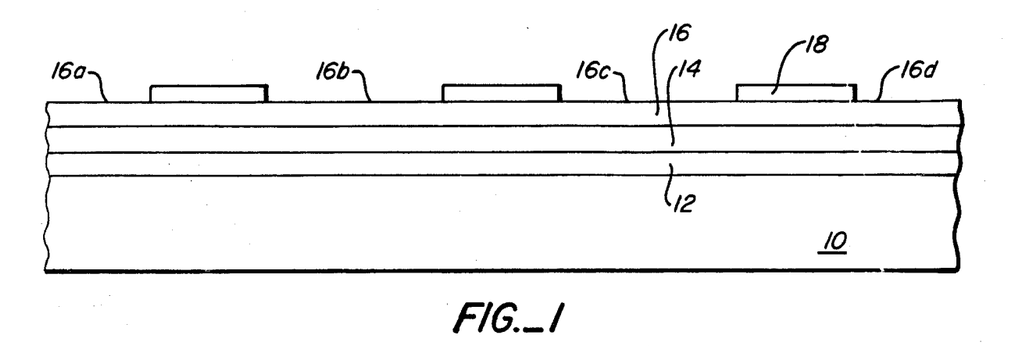
FIGS. 1 to 9 illustrate a portion of a DMOS transistor during various steps of a manufacturing process in accordance with the present invention.

A process in accordance with the present invention begins with the step of forming a silicon dioxide layer 12 on a semiconductor wafer 10 (FIG. 1). In one embodiment of the invention, wafer 10 consists of a layer of N type epitaxial silicon having a conductivity of about 1.5 ohm-centimeters and about 12 micrometers thick on a heavily N+ doped substrate. However, other semiconductor materials and materials having other conductivities and conductivity types are also appropriate. (As used herein, the term "wafer" includes the substrate and all layers formed directly or indirectly on the substrate.)

Silicon dioxide layer 12 is typically thermally grown to a thickness of about 50 nanometers (nm). A silicon nitride layer 14 is then formed on silicon dioxide layer 12. Silicon nitride layer 14 is also typically about 50 nm thick and typically is formed by chemical vapor deposition. As will be discussed in greater detail below, silicon dioxide layer 12 and silicon nitride layer 14 serve as gate insulation for a subsequently formed DMOS transistor.

A polycrystalline silicon layer 16 is then formed on silicon nitride layer 14. In one embodiment, polycrystalline silicon layer 16 is formed to a thickness of about 500 nm by chemical vapor deposition. As described in greater detail below, polycrystalline silicon layer 16 serves as the gate of the DMOS transistor. Polycrystalline silicon layer 16 is then doped to a sheet resistance of about 15 ohms per square with an N type dopant such as phosphorus.

Figure 2:
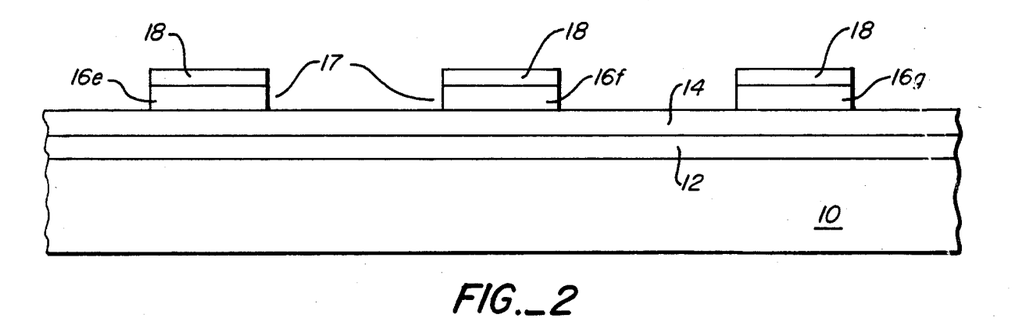

Polycrystalline silicon layer 16 is then covered with a photoresist layer 18 which is then patterned in a conventional manner, thereby exposing portions 16a to 16d of polycrystalline silicon layer 16. Exposed portions 16a to 16d of polcrystalline silicon layer 16 are then removed, thereby leaving polycrystalline silicon gates 16e and 16f and a field limiting ring 16g as illustrated in FIG. 2. (In other embodiments, gates 16e and 16f and field limiting ring 16g are of a material other than polycrystalline silicon, e.g. a metal such as refractory metal or a silicide).) Although polycrystalline silicon gates 16e and 16f appear as separate structures, in one embodiment they are a single contiguous polycrystalline silicon gate 17 joined outside the cross section of FIG. 2. (In another embodiment, gates 16e and 16f are not a single contiguous region. However, in such an embodiment, gates 16e and 16f can be electrically connected together with a subsequently formed conductive layer.) As described below, field limiting ring 16g surrounds the transistor and defines a subsequently formed EQR which surrounds ring 16g. In this way, photoresist layer 18 serves as a first mask for defining the gate of the DMOS transistor, a field limiting ring, and an EQR surrounding the transistor.

Figure 3:
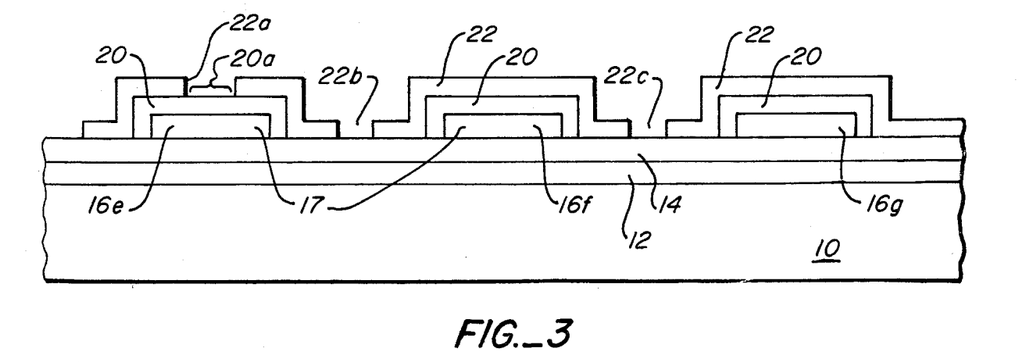

Referring to FIG. 3, the remaining portions of photoresist layer 18 are removed and polycrystalline silicon gate 17 and ring 16g are covered with a silicon dioxide layer 20. In one embodiment, silicon dioxide layer 20 is thermally grown to a thickness of about 500 nm.

The wafer is then covered with a photoresist layer 22 which is then patterned in a known manner, thereby forming window regions 22a, 22b, and 22c in a photoresist layer 22. As will hereinafter become apparent, window region 22a defines an electrical contact to polycrystalline silicon gate 17 while regions 22b and 22c define a P+ deep body region of the DMOS transistor.

Figure 4:
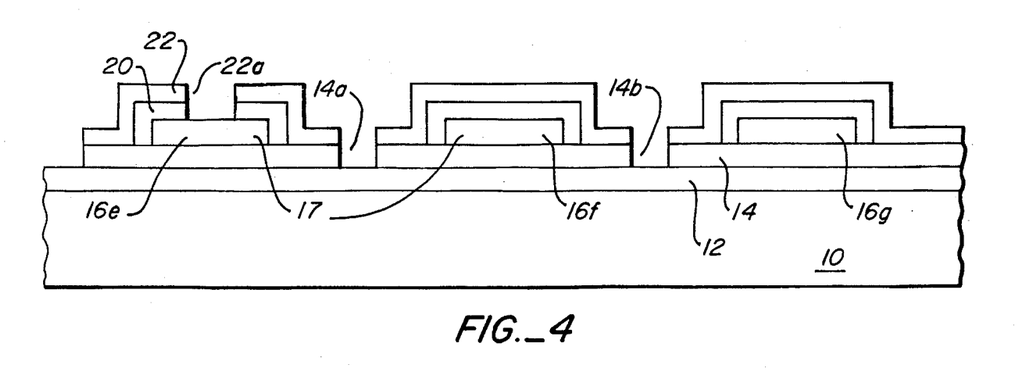

Referring to FIG. 4, portion 20a of silicon dioxide layer 20 within window region 22a is removed and the portions of silicon nitride layer 14 within window regions 22b and 22c are removed. In one embodiment, portion 20a is removed by placing wafer 10 in a buffered HF solution. Of importance, photoresist layer 22 protects the underlying portions of silicon dioxide layer 20. However, the portion of silicon dioxide layer 20 within window region 22a is unprotected and therefore is removed by the HF solution. In addition, an oxidized nitride skin, typically formed to a thickness of 5 to 10 nm during the preceding process steps within window regions 22b and 22c, is also removed by the HF solution.

Figure 5:
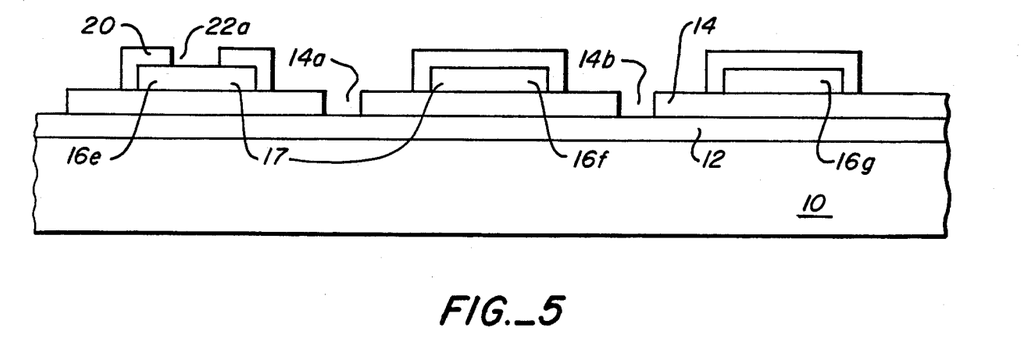

Thereafter, wafer 10 is removed from the buffered HF solution and placed, for example, in a phosphoric acid solution which removes the portions of silicon nitride layer 14 within window regions 22b and 22c, thereby forming window regions 14a and 14b. Wafer 10 is then removed from the phosphoric acid solution and photoresist layer 22 is removed. The resulting structure is illustrated in FIG. 5.

In other embodiments of the invention, instead of using an HF solution and phosphoric acid to etch silicon dioxide layer 20 and silicon nitride layer 14, respectively, plasma etching, reactive ion etching, or ion milling are used.

Figure 6:
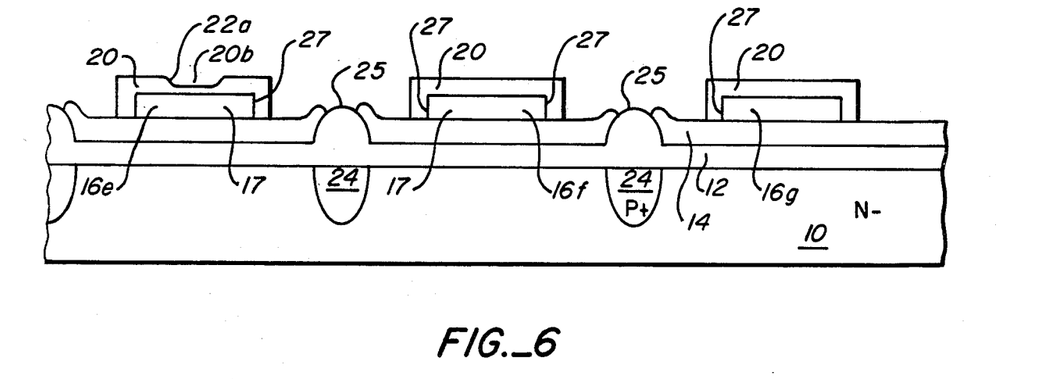

Referring to FIG. 6, P+ deep body regions 24 are formed in the semiconductor material within wafer 10, e.g., by implanting P type ions in the portion of wafer 10 within window regions 14a and 14b. In one embodiment, boron ions are implanted with a dosage of about $2 \times 10^{14}/cm^2$ and an implant energy of about 40 Kev. (Of importance, the implant energy and dose are selected to guarantee that ions are not implanted into the portions of the wafer covered by both silicon dioxide layer 12 and silicon nitride layer 14.) Although during this process some ions are also implanted into polycrystalline silicon gate 17 where silicon dioxide layer 20 has been removed, because of the high N type dopant concentration in polycrystalline silicon gate 17, the gate conductivity is not significantly changed during this process. It is also noted that the portions of silicon dioxide layer 12 within window regions 14a and 14b prevent unwanted introduction of impurities into the semiconductor material within window regions 14a and 14b and prevent unwanted loss of boron during subsequent high temperature processing steps.

The wafer is then subjected to a drive-in process. During this drive-in process, a thin silicon dioxide layer 20b (typically about 50 nm thick) is formed on polycrystalline silicon 16e. In addition, portions 25 of silicon dioxide layer 12 above P+ deep body regions 24 also increase in thickness. Of importance, during the diffusion of P+ regions 24, silicon dioxide layers 20b and 25 prevent impurities from diffusing out of gate 17 and into the substrate or epitaxial layer within wafer 10.

Figure 6A:
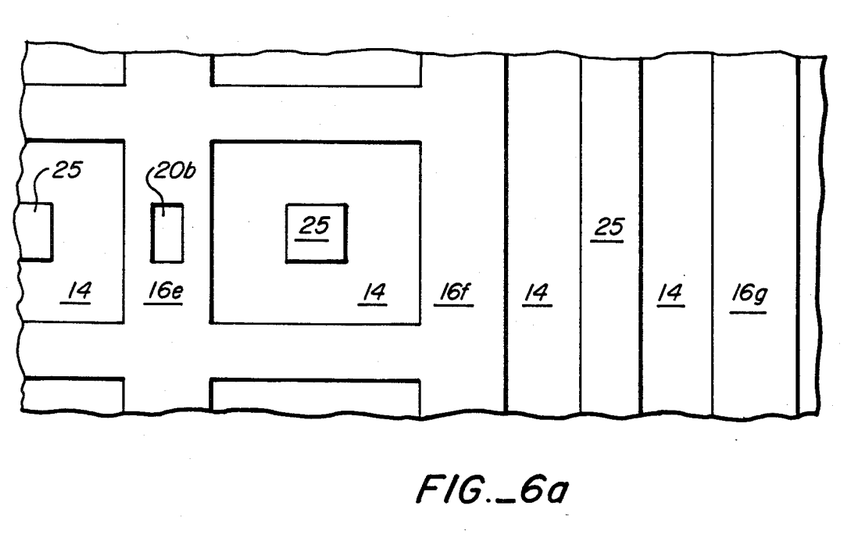

FIG. 6a illustrates in plan view a portion of the transistor at this point in the manufacturing process. Region 24 and layer 20 are not shown in FIG. 6a to simplify the illustration.

The portions of silicon nitride layer 14 not covered by gate 17 or polycrystalline silicon ring 16g are then removed. In one embodiment this is done by placing the wafer in phosphoric acid solution. However, the exposed portions of silicon nitride layer 14 can be removed in other ways as well, e.g., reactive ion etching or plasma etching. Silicon dioxide layer 20b and the exposed portions of silicon dioxide layer 12 are then removed by placing the wafer in a buffered HF solution. In other embodiments, layer 20b and the exposed portions of silicon dioxide layer 12 are removed with plasma etching or reactive ion etching. Of importance because of the thickness of silicon dioxide layers 20 (500 nm) and 25 (220 to 230 nm), silicon dioxide layer 20 and 25 remain largely intact during this etching process. In addition, the portions of silicon nitride layer 14 and silicon dioxide layer 12 underneath gate 17 and polycrystalline silicon ring 16g also remain. Of importance, up to this point in the process, only two photolithographic masks have been applied to the wafer.

Figure 7:
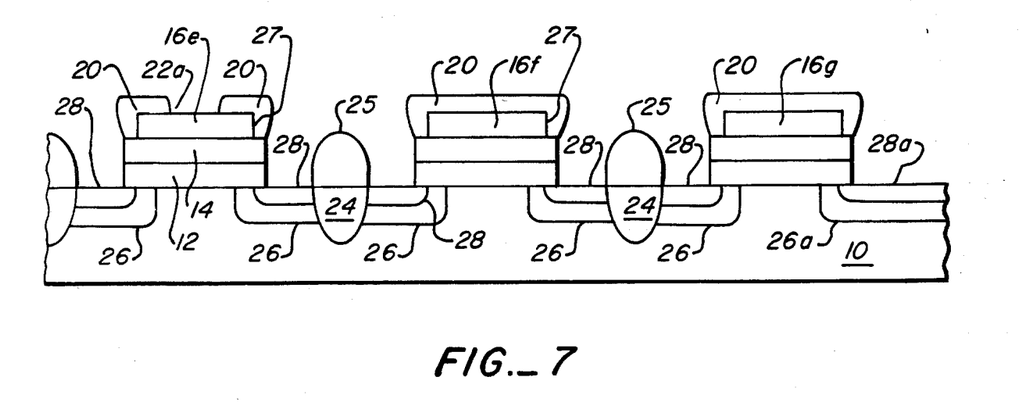

Referring to FIG. 7, P type body region 26 is formed, e.g. by ion implantation. In one embodiment, boron ions are implanted into wafer 10 with a dosage of about $5 \times 10^{13}/cm^2$ and an implant energy of approximately 50 Kev. Of importance, the lateral extent of P type body region 26 is defined by edges 27 of gate 17. Therefore, no additional photolithographic masks or alignment steps are required during formation of body region 26. The wafer is then subjected to a drive-in process.

A P type region 26a is formed concurrently with body region 26. However, as described below, P region 26a does not serve as a body region, but rather as part of an EQR.

Thereafter, N+ source regions 28 are formed, e.g. by ion implantation. In one embodiment, arsenic ions are implanted into wafer 10 with a dosage of about $5 \times 10^{15}/cm^2$ and an implant energy of about 40 Kev. The lateral extent of N+ source regions 28 is also defined by edges 27 of gate 17 and the edge of silicon dioxide 25. The wafer is then subjected to another drive-in process. Thereafter, silicon dioxide 25 and any silicon dioxide formed above source regions 28 or within window 22a during the same drive-in process is removed in a blanket etching process, e.g. by placing the wafer in a buffered HF solution.

An N+ region 28a is formed concurrently with N+ source region 28. However, as described below, N+ region 28a does not serve as a source region but rather as part of the EQR.

Figure 8:
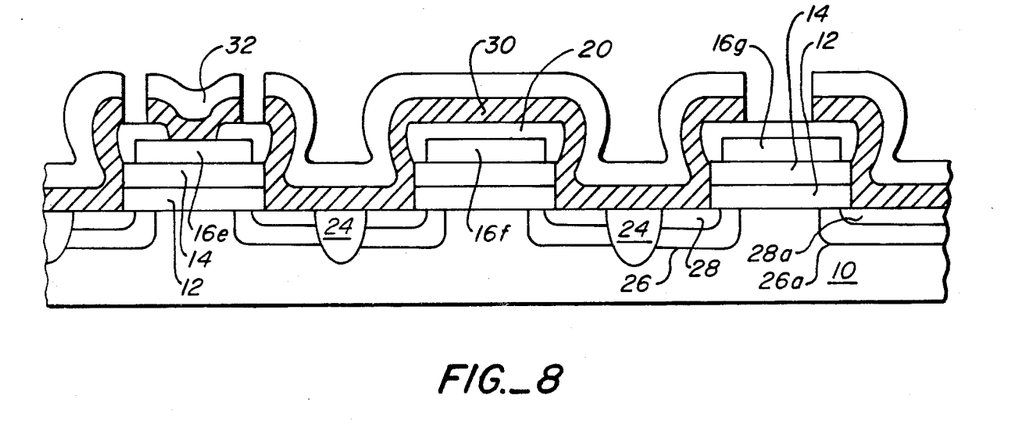

Referring to FIG. 8, the wafer is covered with a conductive layer 30. Conductive layer 30 is typically a metal layer such as aluminum or an alloy of aluminum. In other embodiments, conductive layer 30 is another metal. Conductive layer 30 serves as a source/body lead for the transistors as well as a gate lead. The wafer is then covered with a photoresist layer 32 which is patterned in a conventional manner, thereby exposing portions of conductive layer 30. The exposed portions of conductive layer 30 are then removed as illustrated in FIG. 8.

Photoresist layer 32 is then removed and the wafer is covered with a passivating layer of insulation such as plasma deposited silicon nitride layer 34. In other embodiments, layer 34 is silicon dioxide. Portions of conductive layer 30 extend to an area on the wafer where bonding pads are formed (not shown). Passivating layer 34 is patterned by applying a fourth photolithographic mask to the wafer. The fourth photolithographic mask includes window regions exposing the portions of the passivating layer 34 above the bonding pads. The exposed portions of passivating layer 34 are then removed, thereby exposing the portions of conductive layer 30 at the bonding pad.

Figure 9:
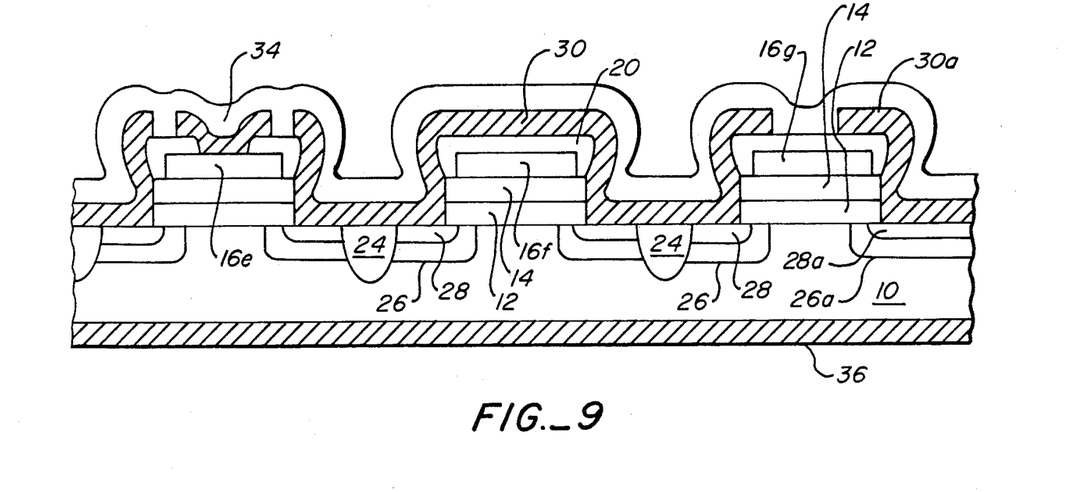

After passivation layer 34 is patterned, a conductive layer 36 (also typically a metal such as aluminum) is formed on the bottom of the wafer (FIG. 9). Conductive layer 36 serves as a drain contact, and is typically not patterned.

A portion 30a of conductive layer 30 (the EQR) is then shorted to the substrate and P region 26a. In one embodiment, this is accomplished by applying a high voltage to portion 30a of conductive layer 30 relative to the substrate Portion 30a is typically shorted to the substrate and P region 26a during wafer sort. (Wafer sort is the electrical testing of devices formed in the wafer before the wafer is cut into separate devices.) As mentioned above, the EQR is formed at the periphery of the transistors. As is known in the art, EQRs enhance reliability of a transistor. EQRs are described in "Surface Breakdown In Silicon Planar Diodes Equipped With Field Plate" by Conti et al., published in Solid State Electronics in 1972, Vol. 15, and incorporated herein by reference.

As mentioned above, polycrystalline ring 16g serves as a field limiting ring. Ring 16g is typically electrically insulated from the other structures formed on the wafer. In an alternative embodiment, a plurality of polycrystalline silicon field limiting rings surround the transistor to further enhance transistors reliability.

It will be appreciated that a process for manufacturing a DMOS transistor requiring only four photolithographic masks has been described in detail. The process is simple and minimizes the requirement of alignment tolerances. Accordingly, a transistor manufactured with the present process can be manufactured on a smaller surface area than prior art transistors. For example, in a typical prior art transistor, the gate to gate distance (e.g. from polycrystalline silicon 16e to 16f) is about 25 to 30 $\mu$m. By using the process of the present invention, this distance can be reduced to about 22 to 28 $\mu$m. This represents a savings of about 20% of the surface area of a transistor using a plurality of square cells.

In an alternative embodiment, the above-described process is used to form an insulated gate bipolar transistor. In such an embodiment, source 28, body 26 and deep body region 24 are formed in an N type epitaxial layer which in turn is formed on a P+ substrate. The operation of insulated gate transistor is described in detail in "The Insulated Gate Transistor: A New Three-Terminal MOS-Controlled Bipolar Device," by Baliga et al., published in IEEE Transactions on Electron Devices, Vol. ED-31., No. 6, in June 1984, and incorporated herein by reference.

While the invention has been described with reference to specific details, those skilled in the art will recognize that changes can be made in form and detail without departing from the spirit and scope of the invention. For example, both N and P channel transistors can be formed using this process. In addition, the transistor can be formed either in a substrate or in an epitaxial layer formed on a substrate. Accordingly, all such modifications come within the present invention.

We claim:

1. A process for manufacturing a transistor comprising the steps of:

forming a first insulating layer on a first semiconductor region, said first semiconductor region having a first conductivity type;

forming a conductive gate on said first insulating layer;

forming a second insulating layer on said conductive gate;

forming a mask above said second insulating layer and the portion of said first insulating layer not covered by said conductive gate, said mask having a first window region defining a portion of said second insulating layer and a second window region defining a portion of said first semiconductor region;

introducing impurities into said portion of said first semiconductor region defined by said second window region, thereby forming a second semiconductor region of a second conductivity type within said first semiconductor region, said second semiconductor region serving as a deep body region for said transistor;

forming a third semiconductor region of said second conductivity type within said first semiconductor region, said third semiconductor region being contiguous with said second semiconductor region;

forming a fourth semiconductor region of said first conductivity type within said third semiconductor region; and forming an opening in said second insulating layer, said opening being defined by said first window said opening serving as a gate contact.

2. The process of claim 1 wherein the lateral extent of said third and fourth semiconductor regions is defined by said conductive gate.

3. The process of claim 1 further comprising the steps of:

forming an electrically conductive layer on the surface of said second and fourth semiconductor regions and said gate, a first portion of said electrically conductive layer electrically contacting said gate, a second portion of said electrically conductive layer electrically contacting said second and fourth semiconductor regions, a third portion of said electrically conductive layer serving as bonding pads;

forming a passivating insulation layer on said electrically conductive layer; and etching said passivating insulation layer, thereby exposing said bonding pads, whereby said process uses only four photolithographic masks.

4. The process of claim 3 wherein one of said four photolithographic masks is used to pattern said electrically conductive layer, thereby forming a lead contacting said gate and a lead contacting said second and fourth semiconductor regions.

5. The process of claim 1 wherein said conductive gate is polycrystalline silicon.

6. The process of claim 1 wherein said first insulating layer comprises a silicon dioxide layer and a silicon nitride layer.

7. The process of claim 1 further comprising the step of forming an equipotential ring surrounding said transistor.

8. The process of claim 7 wherein said equipotential ring is formed without any additional alignment steps.

9. The process of claim 7 further comprising the steps of:

forming first, second and third electrically conductive layers, said first electrically conductive layer electrically contacting said gate, said second electrically conductive layer electrically contacting said second and fourth semiconductor regions, said equipotential comprising said third electrically conductive layer.

10. The process of claim 9 wherein said equipotential comprises:

a fifth semiconductor region of said second conductivity type formed in said first semiconductor region; and a sixth semiconductor region of said first conductivity type formed in said fifth semiconductor region, said third electrically conductive layer being formed above and electrically contacting said sixth semiconductor region, said third electrically conductive layer also electrically contacting said fifth and first semiconductor regions.

11. The process of claim 10 wherein said fifth and third semiconductor regions are formed simultaneously and said fourth and sixth semiconductor regions are formed simultaneously.

12. The process of claim 10 wherein said fifth and sixth semiconductor regions are defined by a conductive ring, said conductive ring being formed simultaneously with said conductive gate.

13. A process for manufacturing a transistor comprising the steps of:

forming a first insulating layer on a first semiconductor region, said first semiconductor region having a first conductivity type, said first insulating layer comprising a silicon nitride layer formed on a silicon dioxide layer;

forming a conductive gate on said first insulating layer;

forming a second insulating layer on said conductive gate;

forming a mask above said second insulating layer and the portion of said first insulating layer not by said conductive gate, said mask having a first window region defining a portion of said second insulating layer and a second window region defining a portion of said first semiconductor region;

removing the portion of said silicon nitride layer within said second window region;

introducing impurities into said portion of said first semiconductor region defined by said second window region, thereby forming a second semiconductor region of a second conductivity type within said first semiconductor region, said second semiconductor region serving as a deep body region for said transistor;

forming a masking layer above said second semiconductor region, the edge of said masking layer being defined by said second window region;

forming a third semiconductor region of said second conductivity type within said first semiconductor region, said third semiconductor region being contiguous with said second semiconductor region;

forming a fourth semiconductor region of said first conductivity type within said third semiconductor region, the lateral extent of said fourth semiconductor region being defined by said conductive gate and said masking layer; and forming an opening in said second insulating layer, said opening being defined by said first window region, said opening serving as a gate contact.

14. The process of claim 13 wherein said masking layer comprises silicon dioxide, said process further comprising the steps of:

removing the portions of said silicon nitride layer not covered by said conductive gate with a first blanket etching process after said step of forming said second semiconductor region;

removing said masking layer and the portion of said silicon dioxide layer not covered by said conductive gate with a second blanket etching process after forming said fourth semiconductor region, thereby exposing portions of said second and fourth semiconductor regions; and forming electrically conductive material on said exposed portions of said second and fourth semiconductor regions.

15. The process of claim 14 further comprising the step of removing said portion of said second insulating layer within said first window region prior to said step of forming said second semiconductor region.

16. A process for manufacturing a transistor comprising the steps of:
- forming an insulation layer on a first semiconductor region having a first conductivity type;
- forming a conductive gate on said insulation layer;
- forming a conductive ring laterally surrounding said conductive gate during said step of forming a conductive gate;
- forming a second semiconductor region having a second conductivity type within said first semiconductor region, said second semiconductor region serving as the transistor body region;
- forming a third semiconductor region having said second conductivity type within said first semiconductor region, said third semiconductor region laterally surrounding said conductive ring, an edge of said conductive ring defining an edge of said third semiconductor region, said third semiconductor region being formed during said step of forming said second semiconductor region;
- forming a fourth semiconductor region of said first conductivity type within said second semiconductor region, said fourth semiconductor serving as the transistor source region;
- forming a fifth semiconductor region of said first conductivity type within said third semiconductor region, an edge of said fifth semiconductor region being defined by said edge of said conductive ring; and
- forming a conductive layer over said fifth semiconductor region, said conductive layer being electrically connected to said first, third, and fifth semiconductor regions, said conductive layer serving as equipotential ring.

17. A process for manufacturing a transistor comprising the steps of:
- forming an insulation layer on a first semiconductor region having a first conductivity type;
- forming a conductive gate on said insulation layer;
- forming a second semiconductor region having a second conductivity type within said first semiconductor region, said second semiconductor region serving as a transistor body region;
- forming a third semiconductor region of said first conductivity type within said second semiconductor region;
- forming a fourth semiconductor region of said second conductivity type within said first semiconductor region, said fourth semiconductor region laterally surrounding said transistor;
- forming a fifth semiconductor region of said first conductivity type within said fourth semiconductor region; and;
- forming a conductive layer over said fifth semiconductor region, said conductive layer being electrically connected to said first, fourth and fifth semiconductor regions, said conductive layer serving as an equipotential ring.

18. The process of claim 17, wherein said second and fourth semiconductor regions are formed simultaneously and said third and fifth semiconductor regions are formed simultaneously.

19. The process of claim 17, wherein said conductive layer comprises a metal.

* * * * *

UNITED STATES PATENT AND TRADEMARK OFFICE
CERTIFICATE OF CORRECTION

PATENT NO. : 4,798,810

DATED : January 17, 1989

INVENTOR(S) : Richard A. Blanchard and Adrian Cogan

It is certified that error appears in the above-identified patent and that said Letters Patent is hereby corrected as shown below:

Col. 3, line 30, "silicide).)" should read --silicide.)--

Col. 5, line 63, after "substrate" insert --.--.

Col. 7, line 53, Claim 9, insert --ring-- after "equipotential".

Col. 7, line 55, Claim 10, insert --ring-- after "equipotential".

Claim 2 should read as follows:

2. (Amended) The process of Claim 1 wherein said steps of forming said third and fourth semiconductor regions comprise the step of introducing impurities into said first semiconductor region, said gate serving as a mask during said step of introducing impurities so that the lateral extent of said third and fourth semiconductor regions is defined by said conductive gate.

In the Abstract, line 9, "(window 22a))" should read -- (window) (22a) --.

In the Abstract, line 10, "(window 14a))" should read --(window) (14a)--

UNITED STATES PATENT AND TRADEMARK OFFICE
CERTIFICATE OF CORRECTION

PATENT NO. : 4,798,810

DATED : January 17, 1989

INVENTOR(S) : Richard A. Blanchard and Adrian Cogan

It is certified that error appears in the above-identified patent and that said Letters Patent is hereby corrected as shown below:

In the Abstract, line 24, "28), respectively)." should read --(28), respectively.--.

Signed and Sealed this

Sixteenth Day of January, 1990

*Attest:*

JEFFREY M. SAMUELS

*Attesting Officer*     *Acting Commissioner of Patents and Trademarks*